(12) United States Patent
Yukawa et al.

(10) Patent No.: US 7,147,984 B2
(45) Date of Patent: *Dec. 12, 2006

(54) POSITIVE-WORKING CHEMICAL-AMPLIFICATION PHOTORESIST COMPOSITION

(75) Inventors: Hiroto Yukawa, Yokohama (JP);
Katsumi Oomori, Chigasaki (JP);
Ryusuke Uchida, Hillsboro, OR (US);
Yukihiro Sawayanagi, Iida (JP)

(73) Assignee: Tokyo Ohka Kogyo Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/810,902

(22) Filed: Mar. 29, 2004

(65) Prior Publication Data

US 2004/0191677 A1 Sep. 30, 2004

Related U.S. Application Data

(63) Continuation of application No. 10/126,673, filed on Apr. 22, 2002, now abandoned, which is a continuation of application No. 09/376,304, filed on Aug. 18, 1999, now abandoned.

(30) Foreign Application Priority Data

Aug. 21, 1998 (JP) .................................. 10-235453

(51) Int. Cl.
*G03C 1/73* (2006.01)
*G03F 7/039* (2006.01)

(52) U.S. Cl. ................... 430/270.1; 430/326; 430/910; 430/914; 430/921; 430/925

(58) Field of Classification Search ............. 430/270.1, 430/326, 910, 914, 921, 925
See application file for complete search history.

(56) References Cited

U.S. PATENT DOCUMENTS

| | | | |
|---|---|---|---|
| 5,272,035 A | 12/1993 | Sekiya | 430/157 |
| 5,393,624 A | 2/1995 | Ushijima | 430/30 |
| 5,565,304 A | 10/1996 | Honda | 430/311 |
| 5,716,753 A | 2/1998 | Yoshimoto et al. | 430/191 |
| 5,744,281 A | 4/1998 | Niki et al. | 430/270.1 |
| 5,759,739 A | 6/1998 | Takemura et al. | 430/270.1 |
| 5,800,966 A | 9/1998 | Ueda et al. | 430/283.1 |
| 5,852,128 A | 12/1998 | Padmanaban et al. | 525/328.8 |
| 5,861,231 A | 1/1999 | Barclay et al. | 430/270.1 |
| 6,136,500 A | 10/2000 | Kobayashi et al. | 430/270.1 |
| 6,187,504 B1 | 2/2001 | Suwa et al. | 430/270.1 |
| 6,255,041 B1 * | 7/2001 | Oomori et al. | 430/322 |
| 6,340,553 B1 * | 1/2002 | Oomori et al. | 430/270.1 |
| 6,387,587 B1 * | 5/2002 | Oomori et al. | 430/270.1 |
| 6,815,144 B1 * | 11/2004 | Oomori et al. | 430/270.1 |
| 6,869,745 B1 * | 3/2005 | Oomori et al. | 430/270.1 |
| 6,890,697 B1 * | 5/2005 | Oomori et al. | 430/270.1 |

FOREIGN PATENT DOCUMENTS

| | | |
|---|---|---|
| DE | 1 447956 | 11/1968 |
| DE | 25 09 824 | 9/1975 |
| EP | 0 540 032 | 5/1993 |
| EP | 0 653 681 | 5/1995 |
| EP | 0 701 173 | 3/1996 |

* cited by examiner

*Primary Examiner*—Sin Lee
(74) *Attorney, Agent, or Firm*—Wenderoth, Lind & Ponack, L.L.P.

(57) ABSTRACT

Disclosed is a positive-working chemical-amplification photoresist composition used in the patterning works in the manufacture of semiconductor devices, with which quite satisfactory patterning of a photoresist layer can be accomplished even on a substrate surface provided with an undercoating film of silicon nitride, phosphosilicate glass, borosilicate glass and the like in contrast to the prior art using a conventional photoresist composition with which satisfactory patterning can hardly be accomplished on such an undercoating film. The photoresist composition comprises, besides a film-forming resin capable of being imparted with increased solubility in an alkaline solution by interacting with an acid and a radiation-sensitive acid-generating compound, a phosphorus-containing oxo acid such as phosphoric acid and phosphonic acid or an ester thereof.

5 Claims, No Drawings

POSITIVE-WORKING CHEMICAL-AMPLIFICATION PHOTORESIST COMPOSITION

This is a continuation of Ser. No. 10/126,673 filed Apr. 22, 2002, now abandoned which is a continuation of Ser. No. 09/376,304, filed Aug. 18, 1999, now abandoned.

BACKGROUND OF THE INVENTION

The present invention relates to a novel positive-working chemical-amplification photoresist composition used in the photolithographic works for the formation of a finely patterned resist layer on a substrate surface in the manufacturing process of semiconductor devices and other electronic products. More particularly, the invention relates to a positive-working chemical-amplification photo-resist composition capable of giving an extremely finely patterned resist layer having an excellently orthogonal cross sectional profile free from skirt-trailing on a substrate surface with high photosensitivity and good pattern resolution even when the substrate surface is provided with a thin undercoating film irrespective of the material forming the undercoating film.

As is well known, the manufacturing process of semiconductor devices in the modern electronic technology almost always involves at least one step of photolithographic patterning work to form a finely patterned resist layer on the surface of a substrate material such as a semiconductor silicon wafer by using a photoresist composition. Namely, the substrate surface is coated with a photoresist composition in the form of a solution followed by evaporation of the solvent to form a dried coating layer of the composition which is patternwise exposed to actinic rays to form a latent image of the pattern to be developed by using a developer solution by utilizing the solubility difference between the exposed and unexposed areas in the resist layer. Photoresist compositions are classified into positive-working and negative-working ones depending on the solubility difference caused in the photoresist layer by the patternwise exposure to actinic rays.

While several different types of photoresist compositions are known and employed in the prior art, it is a trend in recent years that the so-called chemical-amplification photoresist compositions or, in particular, positive-working chemical-amplification photoresist compositions are more and more highlighted by virtue of the extremely fine pattern resolution of 0.25 µm or even finer and high photosensitivity attainable therewith. Along with the trend in the semiconductor devices toward a further and further increased density of integration, however, extensive investigations are now under way to develop a positive-working chemical-amplification photoresist composition capable of giving a patterned resist layer having pattern resolution of 0.20 µm or even finer.

Chemical-amplification photoresist composition is formulated by comprising a radiation-sensitive acid-generating compound and a film-forming resinous ingredient capable of being imparted with an increased or decreased solubility in an aqueous alkaline developer solution by interacting with an acid. The principle utilized there is that the acid released from the acid-generating compound in the exposed areas interacts with the resinous ingredient resulting in an increase or decrease in the solubility of the resist layer to leave a patterned resist layer by the development treatment. By virtue of the catalytic interaction of the radiation-released acid with the resinous ingredient, chemical-amplification photoresist compositions are generally excellent in the photosensitivity and pattern resolution even with a relatively small amount of the acid-generating compound.

In the positive-working chemical-amplification photoresist composition, the film-forming resinous ingredient is imparted by interacting with the radiation released acid with an increase in the solubility in an aqueous alkaline developer solution. A most typical film-forming resinous ingredient in the positive-working chemical-amplification photoresist compositions is a homopolymer of hydroxystyrene monomer or a copolymer thereof with other copolymerizable monomers, of which at least a part of the aromatic hydroxyl groups are substituted by acid-dissociable solubility-reducing groups such as tert-butoxycarbonyl groups, tetrahydropyranyl groups and the like, which are dissociated by interacting with the radiation-released acid in the exposed areas to increase the solubility of the resinous ingredient in the exposed areas.

Turning now to the nature of the substrate surface, on which a photoresist layer is formed by using the photoresist composition of the present invention, it is rather usual that the photoresist layer is formed not directly on the surface of a semiconductor silicon wafer per se but on the surface of a thin undercoating film of a great variety of materials formed on the silicon surface depending on the particular object of patterning. Examples of the materials of the above mentioned undercoating film covering the intrinsic substrate surface include phosphorus-containing materials such as phosphosilicate glass (PSG), boron-containing materials such as borosilicate glass (BSG), boron- and phosphorus-containing materials such as borophosphosilicate glass (BPSG), nitrogen- and silicon-containing materials such as silicon nitrides SiN and $Si_3N_4$ and silicon oxynitride SiON for interlayer insulating films and protecting films on a circuit wiring layer as well as semiconductor materials such as polycrystalline silicon (Poly-Si) for gate electrodes and resistance elements. Further, metallic materials such as aluminum, aluminum-silicon-copper alloys, titanium nitride, tungsten and titanium-tungsten alloys are used as a material of electrodes and circuit wirings.

In the manufacturing process of semiconductor devices, a patterned resist layer is formed by the photolithographic patterning method on a substrate provided with a thin undercoating film of a material selected from the above mentioned various materials. When a patterned resist layer is formed from a chemical-amplification photoresist composition on the surface of an undercoating film of a nitrogen-containing material such as silicon nitride and titanium nitride, it is sometimes the case that the patterned resist layer has a cross sectional profile slightly trailing skirts on the substrate surface. Furthermore, when a patterned resist layer is formed on the surface of an undercoating film of PSG, BSG, BPSG and the like, the cross sectional profile of the patterned resist layer is not fully orthogonal but more or less trapezoidal.

Needless to say, the above mentioned non-orthogonal cross sectional profile of the patterned resist layer is very undesirable against subsequent processing steps in the photolithographic patterning work in which extreme fineness of patterning of 0.20 µm or even finer is required. Thus, it is eagerly desired to develop a novel and improved photoresist composition which is free from the above described problems and disadvantages in the conventional photoresist compositions.

SUMMARY OF THE INVENTION

The present invention accordingly has an object to provide a novel and improved positive-working chemical-amplification photoresist composition capable of giving a patterned resist layer which is free from non-orthogonality of the cross sectional profile mentioned above irrespective of the material of the undercoating film on which the photoresist layer is formed by using the photoresist composition.

The inventors have conducted extensive investigations with this object particularly directing their attention to a possible mechanism for the appearance of a skirt-trailing or trapezoidal cross sectional profile of the patterned resist layer formed from a chemical-amplification photoresist composition on an undercoating film containing nitrogen, phosphorus, boron and the like that this undesirable phenomenon is resulted from deactivation of the acid released from the radiation-sensitive acid-generating compound contained in the photoresist composition as a consequence of combining of the acid with the non-covalent electron pairs possessed by the atoms of nitrogen, phosphorus, boron and the like, arriving at a unique measure to prevent deactivation of the acid released from the acid-generating compound.

Thus, the positive-working chemical-amplification photoresist composition provided by the present invention is a uniform solution, in an organic solvent, which comprises:
(A) a film-forming resinous compound capable of being imparted with an increase in the solubility in an aqueous alkaline solution by interacting with an acid;
(B) an acid-generating compound capable of releasing an acid by irradiation with actinic rays; and
(C) an oxo acid of phosphorus or an ester compound thereof, the amount of the component (C) being in the range from 0.01 to 5% by weight based on the component (A).

DETAILED DESCRIPTION OF THE PREFERRED EMBODIMENTS

As is described above, the essential ingredients in the positive-working chemical-amplification photoresist composition include the components (A), (B) and (C), of which the component (A) is a film-forming resinous compound capable of being imparted with an increase in the solubility in an aqueous alkaline solution by interacting with an acid. A variety of such resinous compounds are known in the art of chemical-amplification photoresist compositions and any of them can be used in the present invention without particular limitations. A typical example of such a resinous compound is an alkali-soluble resin having phenolic hydroxyl groups or carboxyl groups, at least a part of which are substituted by acid-dissociable solubility-reducing groups. Namely, the solubility of the inherently alkali-soluble resin is decreased by substitution for the hydroxyl or carboxyl groups by the solubility-reducing groups while the solubility-reducing groups are dissociated in the presence of an acid released by irradiation with actinic rays from the acid-generating compound as the component (B) in the exposed areas of the photoresist layer to regenerate free hydroxyl or carboxyl groups resulting in an increase in the alkali-solubility of the resin.

The above mentioned acid-dissociable solubility-reducing group is not particularly limitative and any of known ones can be used in the component (A). Examples of such a solubility-reducing group include tertiary alkyloxycarbonyl groups such as tert-butoxycarbonyl and tert-amyloxycarbonyl groups, tertiary alkyl groups such as tert-butyl and tert-amyl groups, tertiary alkyloxycarbonyl-alkyl groups such as tert-butoxycarbonylmethyl and tert-amyloxycarbonylmethyl groups, cyclic acetal residues such as tetrahydropyranyl and tetrahydrofuranyl groups, linear acetal residues such as alkoxyalkyl groups, silyl ether groups such as trimethylsilyl group, and so on. Preferable among the above named groups are tertiary alkyloxycarbonyl groups, tertiary alkyl groups, cyclic acetal residues and linear acetal residues in respects of high photosensitivity and pattern resolution as well as excellently orthogonal cross sectional profile of the patterned resist layer.

Particular examples of the resinous compounds suitable as the component (A) include polyhydroxystyrene resins substituted for from 10 to 50% or, preferably, from 15 to 35% of the hydroxyl groups by tert-butoxycarbonyl groups, tert-butoxycarbonylmethyl groups, cyclic acetal residues, such as tetrahydropyranyl and tetrahydrofuranyl groups, and/or alkoxyalkyl groups, i.e. linear acetal residues, such as 1-ethoxyethyl and 1-methoxy-n-propyl groups as well as copolymeric resins consisting of from 50 to 85% by moles of the monomeric units derived from hydroxystyrene and/or α-methyl hydroxystyrene, from 10 to 30% by moles of the monomeric units derived from styrene and from 2 to 20% by moles of the monomeric units derived from acrylic or methacrylic acid esterified with an acid-dissociable solubility-reducing group such as those mentioned above, which is preferably tert-butyl group, as the esterifying group.

Although any one of the above described various resinous compounds can be used singly as the component (A), it is optional that the component (A) is a combination of two kinds or more of these resinous compounds. A particularly preferable resinous ingredient as the component (A) includes combinations of an alkoxyalkyl-substituted polyhydroxystyrene resin and a tert-butoxycarbonyl-substituted polyhydroxystyrene resin or cyclic acetal residue-substituted polyhydroxystyrene resin. More preferably, the component (A) is a ternary copolymeric resin consisting of the monomeric units derived from hydroxystyrene and/or α-methyl hydroxystyrene, styrene and tert-butyl (meth)acrylate used alone in respect of the high pattern resolution and excellently orthogonal cross sectional profile of the patterned resist layer as well as in respect of little roughness, i.e. good smoothness, of edge lines of the resist pattern as viewed from above.

When the component (A) is a combination of the above mentioned two different resins, the proportion of the two resins, i.e. the weight ratio of the tert-butoxycarbonyl- or cyclic acetal residue-substituted polyhydroxystyrene resin to the alkoxyalkyl-substituted polyhydroxystyrene resin, is in the range from 5:95 to 50:50 or, preferably, from 10:90 to 30:70. The above mentioned ternary copolymeric resin as the component (A) can be a combination of two kinds or more of different resins provided that each of them falls within the above given definition of the resin.

The component (B) in the inventive photoresist composition is a radiation-sensitive acid-generating compound capable of releasing an acid by irradiation with actinic rays. A variety of such acid-generating compounds are known in the art of chemical-amplification photoresist compositions. Although any one or any combination of those known compounds can be used as the component (B) in the present invention, it is preferable that the component (B) is selected from onium salt compounds and diazomethane compounds in consideration of the strength of the acid released therefrom by irradiation with actinic rays and activity for the dissociation of the acid-dissociable solubility-reducing groups in the component (A) and transparency to the exposure light.

Examples of the above mentioned diazomethane compounds include bis(cyclohexylsulfonyl) diazomethane, bis(tert-butylsulfonyl) diazomethane, bis(isopropylsulfonyl) diazomethane, bis(4-methylphenylsulfonyl) diazomethane and bis(2,4-dimethylphenylsulfonyl) diazomethane.

The above mentioned onium salt compound is preferably an onium salt compound having a fluoroalkylsulfonate as the anion including diphenyliodonium1 salt compounds represented by the general formula

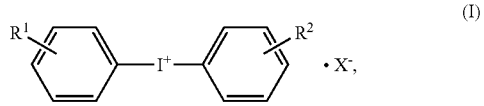

(I)

in which $R^1$ and $R^2$ are each, independently from the other, a hydrogen atom, an alkyl group having 1 to 4 carbon atoms or an alkoxy group having 1 to 4 carbon atoms and $X^-$ is a fluoroalkylsulfonate anion having 1 to 10 carbon atoms, and triphenylsulfonium salt compounds represented by the general formula

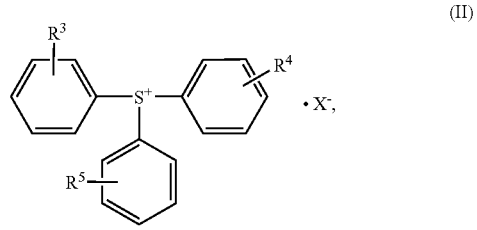

(II)

in which $R^3$, $R^4$ and $R^5$ are each, independently from the others, a hydrogen atom, an alkyl group having 1 to 4 carbon atoms or an alkoxy group having 1 to 4 carbon atoms and $X^-$ has the same meaning as defined above.

Particular examples of the onium salt compounds as the component (B) falling within the above given definition of the compound include diphenyliodonium trifluoromethanesulfonate and nonafluorobutanesulfonate, bis(4-tert-butylphenyl)iodonium trifluoromethanesulfonate and nonafluorobutanesulfonate, triphenylsulfonium trifluoromethanesulfonate and nonafluorobutanesulfonate and tri(4-methylphenyl)sulfonium trifluoromethanesulfonate and nonafluorobutanesulfonate, of which bis(4-tert-butylphenyl)-iodonium trifluoromethane- and nonafluorobutanesulfonates and triphenylsulfonium trifluoromethane- and nonafluorobutanesulfonates are particularly preferable in respect of high pattern resolution and excellently orthogonal cross sectional profile of the patterned resist layer.

The above described various acid-generating compounds can be used either singly or as a combination of two kinds or more as the component (B) according to need. The amount of the component (B) in the inventive photoresist composition is in the range from 1 to 20 parts by weight or, preferably, from 1 to 10 parts by weight per 100 parts by weight of the resinous ingredient as the component (A). When the amount of the component (B) is too small, image formation in the photoresist layer can hardly be accomplished by the patternwise exposure of the layer to actinic rays. When the amount thereof is too large, on the other hand, a trouble is encountered that a portion of the compound remains undissolved not to give a uniform solution as the photoresist composition due to the limited solubility of the compound in an organic solvent or, even if a uniform solution could be obtained, the photoresist composition suffers a decrease in the storage stability.

The component (C), which is the most characteristic ingredient in the inventive photoresist composition, is a phosphorus-containing oxo acid or an ester compound thereof. It is the most unexpected discovery leading to the present invention that admixture of a chemical-amplification photoresist composition with such a phosphorus-containing oxo acid or ester thereof has an effect of preventing the undesirable phenomenon of non-orthogonality of the cross sectional profile of the patterned resist layer formed on a substrate surface having an undercoating film of a variety of materials including nitrogen-containing materials such as silicon nitride, silicon oxynitride and titanium nitride, phosphorus-containing materials such as PSG, boron-containing materials such as BSG and phosphorus- and boron-containing materials such as BPSG. The mechanism leading to this advantageous effect is, though not well understood, presumably due to the fact that the above mentioned disadvantage in patterning is caused by the deactivation of the acid released from the component (B) as a consequence of combining thereof with the non-covalent electron pairs possessed by the atoms of nitrogen, phosphorus and boron in the materials of the undercoating film and the phosphorus-containing oxo acid or an ester thereof acts to disturb combining of the acid with the non-covalent electron pairs without adversely affecting the photosensitivity and pattern resolution in patterning with the photoresist composition.

Examples of the phosphorus-containing oxo acid include phosphoric acid, phosphorous acid, phosphonic acid, phenyl-phosphonic acid, phosphinic acid and phenylphosphinic acid. Examples of the ester compound of these acid compounds include mono-, di- and triesters of the acid with methyl, ethyl, n-butyl, benzyl and phenyl groups such as phosphoric acid di-n-butyl ester, phosphoric acid diphenyl ester, phosphonic acid dimethyl ester, phosphonic acid di-n-butyl ester, phosphonic acid diphenyl ester, phosphonic acid dibenzyl ester and the like. These phosphorus-containing oxo acids and esters thereof can be used either singly or as a combination of two kinds or more according to need as the component (C). It is preferable that the component (C) is in the form of an acid rather than in the form of an ester compound.

The amount of the component (C) in the inventive photoresist composition is in the range from 0.01 to 5 parts by weight or, preferably, from 0.1 to 2.0 parts by weight per 100 parts by weight of the resinous ingredient as the component (A) in respect of the improving effect on the appearance of a skirt-trailing or trapezoidal cross sectional profile of the resist pattern, suppression of thickness reduction of the resist layer by development and so on. When the amount of the component (C) is too small, the advantageous effect to be obtained by the addition of this component cannot be fully obtained as a matter of course while, when the amount thereof is too large, an unduly large thickness reduction may be caused in the unexposed areas of the photoresist layer by the development treatment with an aqueous alkaline developer solution.

Besides the above described essential components (A), (B) and (C), the positive-working chemical-amplification photoresist composition can be compounded according to need with a secondary or tertiary amine compound such as triethylamine, tributylamine, dibutylamine, triethanolamine and the like to serve as a quenching agent and an antireflective agent such as benzophenone compounds to reduce reflection of the exposure light at the substrate surface.

It is usual that the photoresist composition of the present invention comprising the above described essential and optional ingredients is used in the form of a solution prepared by uniformly dissolving the various ingredients in an organic solvent. Examples of suitable organic solvents include ketone compounds such as acetone, methyl ethyl ketone, cyclohexanone, methyl isoamyl ketone and 2-heptanone, polyhydric alcohols and derivatives thereof such as ethyleneglycol, ethyleneglycol monoacetate, propyleneglycol, propyleneglycol monoacetate, diethyleneglycol, diethyleneglycol monoacetate, dipropyleneglycol and dipropyleneglycol monoacetate as well as monomethyl, monoethyl, monopropyl, monobutyl and monophenyl ether compounds thereof, cyclic ethers such as dioxane and ester compounds such as methyl lactate, ethyl lactate, methyl acetate, ethyl acetate, butyl acetate, methyl pyruvate, ethyl pyruvate, methyl methoxypropionate and ethyl ethoxypropionate. These organic solvents can be used either singly or as a mixture of two kinds or more according to need.

It is of course optional that the photoresist composition of the invention prepared in the above described manner is further admixed with various kinds of known additives having compatibility each in a limited amount including auxiliary resinous compounds to improve or modify the properties of the resist film, plasticizers, stabilizers, coloring agents, surface active agents and the like.

The procedure of the patterning work on a substrate surface by using the photoresist composition of the invention is not particularly different from conventional procedures. Namely, the surface of a substrate is coated with the photoresist composition by using a suitable coating machine such as a spinner followed by drying to form a photoresist layer which is then patternwise exposed to actinic rays such as a KrF excimer laser beam of 248 nm wavelength through a photomask bearing a desired pattern on a suitable exposure machine to form a latent image of the pattern followed by a post-exposure baking treatment and a development treatment of the latent image by using an aqueous alkaline developer solution such as a 0.1 to 10% by weight aqueous solution of tetramethylammonium hydroxide to give a patterned resist layer with high photosensitivity and excellent pattern resolution of 0.2 µm or even finer. The thus obtained patterned resist layer has high fidelity to the photomask pattern and has an excellently orthogonal, non-trapezoidal cross sectional profile without skirt-trailing. The actinic rays for patternwise exposure are not limited to excimer laser beams but can be X-rays or electron beams.

The substrate material to be subjected to the above mentioned patterning procedure by using the inventive photoresist composition is not limited to a semiconductor silicon wafer per se but the inventive photoresist composition is applicable to a substrate surface provided with an undercoating thin film irrespective of the surface nature of the undercoating film. In particular, the inventive photoresist composition is applicable to the surface of even an undercoating film of a material containing nitrogen or containing phosphorus and/or boron in contrast to the prior art by using a conventional photoresist composition in which satisfactory patterned resist layer can hardly be obtained on a substrate surface having an undercoating film of these materials. Examples of nitrogen-containing materials for the undercoating film include silicon mononitride SiN, trisilicon tetranitride $Si_3N_4$, silicon oxynitride SiON and titanium nitride TiN. Examples of the phosphorus- and/or boron-containing materials of the undercoating film include phosphosilicate glass, borosilicate glass and borophosphosilicate glass.

In the following, the positive-working chemical-amplification photoresist composition of the present invention is described in more detail by way of examples, which, however, never limit the scope of the invention in any way.

EXAMPLE 1

A positive-working photoresist composition in the form of a solution was prepared by uniformly dissolving, in 800 parts by weight of propyleneglycol monomethyl ether acetate, 60 parts by weight of a first copolymeric resin consisting of 65% by moles of hydroxystyrene units, 20% by moles of styrene units and 15% by moles of tert-butyl acrylate units and having a weight-average molecular weight of 10,000, 40 parts by weight of a second copolymeric resin consisting of 65% by moles of hydroxystyrene units, 30% by moles of styrene units and 5% by moles of tert-butyl acrylate units and having a weight-average molecular weight of 10,000, 5 parts by weight of triphenylsulfonium trifluoromethane-sulfonate, 0.29 part by weight of phenylphosphonic acid and 0.27 part by weight of triethanolamine followed by filtration of the solution through a membrane filter having a 0.2 µm pore diameter.

Nextly, a 6-inch semiconductor silicon wafer provided with an undercoating film of silicon mononitride was coated with the above prepared photoresist solution on a spinner followed by heating on a hot plate at 130° C. for 90 seconds to form a dried layer of the photoresist composition having a thickness of 0.7 µm. The photoresist layer was then patternwise exposed to a KrF excimer laser beam through a photomask on a minifying projection exposure machine (Model FPA-3000EX3, manufactured by Canon Co.) followed by a post-exposure baking treatment at 110° C. for 90 seconds. The development treatment of the thus treated photoresist layer was undertaken by puddle development with a 2.38% by weight aqueous solution of tetramethylammonium hydroxide at 23° C. for 65 seconds to give a positively patterned resist layer.

The pattern resolution of the thus patterned resist layer was so high as to fully resolve a line-and-space pattern of 0.18 µm line width. The cross sectional profile of the line-patterned resist layer was excellently orthogonal standing upright on the substrate surface without trailing of skirts. The photosensitivity of the photoresist composition, as given by the minimum exposure dose to obtain a fully resolved line-and-space pattern of 0.18 µm line width, was 40 $mJ/cm^2$.

EXAMPLE 2

The experimental procedure was substantially the same as in Example 1 except that the silicon wafer as the substrate had an undercoating film of phosphosilicate glass instead of silicon mononitride.

The results of inspection of the thus obtained line-and-space patterned resist layer were that good pattern resolution was obtained for a line-and-space pattern of 0.18 µm line width, the cross sectional profile of the line-patterned resist layer was excellently orthogonal standing upright on the substrate surface and the photosensitivity was 40 $mJ/cm^2$.

EXAMPLE 3

The experimental procedure was substantially the same as in Example 1 except that the silicon wafer as the substrate had an undercoating film of borosilicate glass instead of silicon mononitride.

The results of inspection of the thus obtained line-and-space patterned resist layer were that good pattern resolution was obtained for a line-and-space pattern of 0.18 μm line width, the cross sectional profile of the line-patterned resist layer was excellently orthogonal standing upright on the substrate surface and the photosensitivity was 40 mJ/cm².

EXAMPLE 4

The experimental procedure was substantially the same as in Example 1 except that the silicon wafer as the substrate had an undercoating film of borophosphosilicate glass instead of silicon mononitride.

The results of inspection of the thus obtained line-and-space patterned resist layer were that good pattern resolution was obtained for a line-and-space pattern of 0.18 μm line width, the cross sectional profile of the line-patterned resist layer was excellently orthogonal standing upright on the substrate surface and the photosensitivity was 40 mJ/cm².

EXAMPLE 5

The experimental procedure was substantially the same as in Example 1 excepting for the replacement of phenylphosphonic acid with the same amount of phosphoric acid.

The results of inspection of the thus obtained line-and-space patterned resist layer were that good pattern resolution was obtained for a line-and-space pattern of 0.18 μm line width, the cross sectional profile of the line-patterned resist layer was excellently orthogonal standing upright on the substrate surface and the photosensitivity was 40 mJ/cm².

EXAMPLE 6

The experimental procedure was substantially the same as in Example 5 except that the silicon wafer as the substrate had an undercoating film of phosphosilicate glass instead of silicon mononitride.

The results of inspection of the thus obtained line-and-space patterned resist layer were that good pattern resolution was obtained for a line-and-space pattern of 0.18 μm line width, the cross sectional profile of the line-patterned resist layer was excellently orthogonal standing upright on the substrate surface and the photosensitivity was 40 mJ/cm².

EXAMPLE 7

The experimental procedure was substantially the same as in Example 5 except that the silicon wafer as the substrate had an undercoating film of borosilicate glass instead of silicon mononitride.

The results of inspection of the thus obtained line-and-space patterned resist layer were that good pattern resolution was obtained for a line-and-space pattern of 0.18 μm line width, the cross sectional profile of the line-patterned resist layer was excellently orthogonal standing upright on the substrate surface and the photosensitivity was 40 mJ/cm².

EXAMPLE 8

The experimental procedure was substantially the same as in Example 5 except that the silicon wafer as the substrate had an undercoating film of borophosphosilicate glass instead of silicon mononitride.

The results of inspection of the thus obtained line-and-space patterned resist layer were that good pattern resolution was obtained for a line-and-space pattern of 0.18 μm line width, the cross sectional profile of the line-patterned resist layer was excellently orthogonal standing upright on the substrate surface and the photosensitivity was 40 mJ/cm².

COMPARATIVE EXAMPLE 1

The experimental procedure was substantially the same as in Example 1 excepting for omission of phenylphosphonic acid in the formulation of the photoresist composition.

The results of inspection of the thus obtained line-and-space patterned resist layer were that pattern resolution was obtained for a line-and-space pattern of 0.25 μm line width but trailing skirts were found in the cross sectional profile of the line-patterned resist layer and the photosensitivity was 30 mJ/cm² for obtaining the line-and-space pattern of 0.25 ∥m line width.

COMPARATIVE EXAMPLE 2

The experimental procedure was substantially the same as in Example 1 excepting for replacement of 0.29 part by weight of phenylphosphonic acid in the formulation of the photoresist composition with 0.19 part by weight of malonic acid.

The results of inspection of the thus obtained line-and-space patterned resist layer were that pattern resolution was obtained for a line-and-space pattern of 0.22 μm line width but trailing skirts were found in the cross sectional profile of the line-patterned resist layer and the photosensitivity was 35 mJ/cm² for obtaining the line-and-space pattern of 0.22 μm line width.

COMPARATIVE EXAMPLE 3

The experimental procedure was substantially the same as in Example 1 excepting for replacement of 0.29 part by weight of phenylphosphonic acid in the formulation of the photoresist composition with 0.28 part by weight of p-toluenesulfonic acid.

The result of inspection of the thus patterned resist layer was that film-thickness reduction in the development on the unexposed areas was so great that the cross sectional profile of the line-patterned resist layer was not orthogonal but semicircular.

COMPARATIVE EXAMPLE 4

The experimental procedure was substantially the same as in Example 4 excepting for omission of phenylphosphonic acid in the formulation of the photoresist composition.

The results of inspection of the thus obtained line-and-space patterned resist layer were that pattern resolution was obtained for a line-and-space pattern of 0.25 μm line width but the cross sectional profile of the line-patterned resist layer was trapezoidal narrowing upwardly and the photosensitivity was 30 mJ/cm² for obtaining the line-and-space pattern of 0.25 μm line width.

What is claimed is:

1. A positive-working chemical-amplification photoresist composition which consists of, as a uniform solution in an organic solvent:
   (A) 100 parts by weight of a film-forming resinous compound having acid-dissociable solubility-reducing groups in the molecule and capable of being imparted with an increased solubility in an aqueous alkaline solution by interaction with an acid, which resinous compound is a copolymeric resin consisting of from 50 to 85% by moles of the monomeric units of hydroxystyrene, from 10 to 30% by moles of the monomeric units of styrene and from 2 to 20% by moles of the monomeric units of a tert-alkylacrylate or methacrylate;
   (B) from 1 to 10 parts by weight of an acid-generating compound which is an onium salt compound having a fluoroalkylsulfonate as the anionic constituent;
   (C) from 0.01 to 5 parts by weight of a phosphorus-containing oxo acid,
   (D) an amine selected from the group consisting of secondary amines and tertiary amines, in an amount sufficient to exhibit a quenching effect and
   (E) an organic solvent to dissolve components (A) to (D).

2. The positive-working chemical-amplification photoresist composition as claimed in claim 1 in which the phosphorus-containing oxo acid as the component (C) is selected from the group consisting of phosphoric acid, phosphorous acid, phosphonic acid, phosphinic acid, phenylphosphinic acid and phenylphosphonic acid.

3. The positive-working chemical-amplification photoresist composition as claimed in claim 1 in which the tert-alkyl acrylate or methacrylate is tert-butyl acrylate or methacrylate.

4. The positive-working chemical-amplification photoresist composition as claimed in claim 1 in which the amount of the phosphorus-containing oxo acid as the component (C) is in the range from 0.1 to 2.0 parts by weight per 100 parts by weight of the component (A).

5. The positive-working chemical-amplification photoresist composition according to claim 1 wherein the amine is triethylamine, tributylamine, dibutylamine or triethanolamine.

* * * * *